United States Patent
Teene

(10) Patent No.: US 6,539,509 B1
(45) Date of Patent: Mar. 25, 2003

(54) CLOCK SKEW INSENSITIVE SCAN CHAIN REORDERING

(75) Inventor: Andres R. Teene, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 1222 days.

(21) Appl. No.: 08/650,248

(22) Filed: May 22, 1996

(51) Int. Cl.$^7$ ................................................ G06F 11/00
(52) U.S. Cl. ........................................ 714/727; 714/729
(58) Field of Search ............................. 371/22.3, 22.5, 371/22.1; 326/93; 307/480; 714/727, 726, 729, 731, 744, 733

(56) References Cited

U.S. PATENT DOCUMENTS

| | | | |
|---|---|---|---|
| 4,879,718 A | 11/1989 | Sanner | 371/22.3 |
| 5,109,168 A | 4/1992 | Rusu | 307/480 |
| 5,212,651 A | 5/1993 | Yabe | 364/488 |
| 5,239,215 A * | 8/1993 | Yamaguchi | 307/480 |
| 5,307,286 A | 4/1994 | Rusu et al. | 364/490 |
| 5,337,321 A * | 8/1994 | Ozaki | 371/22.3 |
| 5,381,345 A | 1/1995 | Takegami et al. | 364/491 |
| 5,410,491 A | 4/1995 | Minami | 364/491 |
| 5,459,736 A * | 10/1995 | Nakamura | 371/22.3 |
| 5,465,347 A * | 11/1995 | Chao et al. | 395/550 |
| 5,475,830 A | 12/1995 | Chen et al. | 395/500 |
| 5,481,209 A * | 1/1996 | Lim et al. | 326/93 |
| 5,502,731 A * | 3/1996 | Meltzer | 371/22.3 |

* cited by examiner

*Primary Examiner*—Nadeem Iqbal
(74) *Attorney, Agent, or Firm*—Christopher P. Maiorana, P.C.

(57) ABSTRACT

A method for eliminating scan hold time failures of a scan chain. The method uses information resulting from the distribution of a clock throughout an integrated circuit. In particular, a scan chain is reordered according to the results of the distribution of the clock signal. The distribution of the clock signal provides groups of sequential circuit elements that form the scan chain. The method also includes reordering the sequential circuit elements within at least one group according to a clock skew of the clock signal within the at least one group. The method further includes ordering the groups according to a clock skew of the clock signal between the groups.

12 Claims, 4 Drawing Sheets

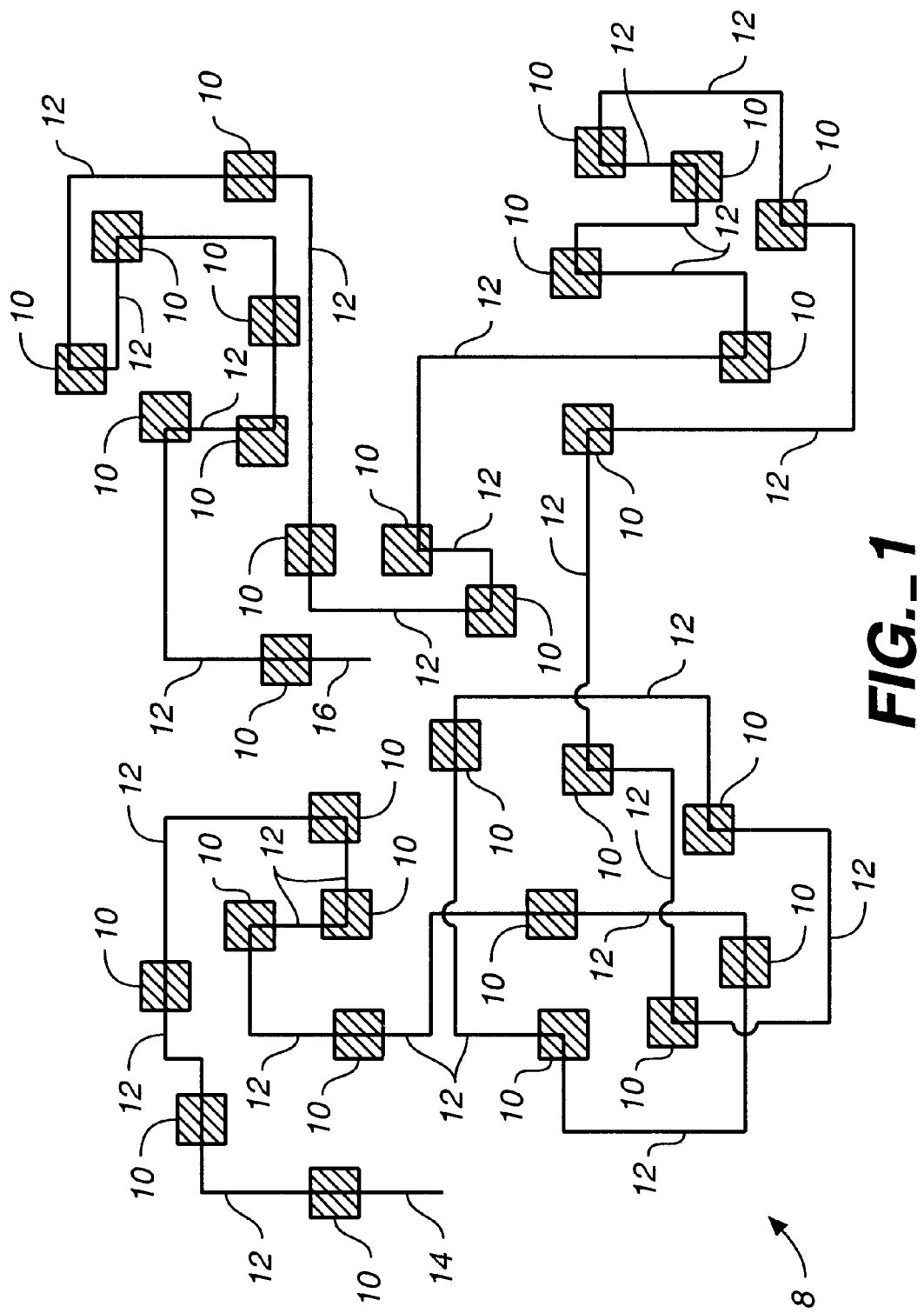
FIG._1

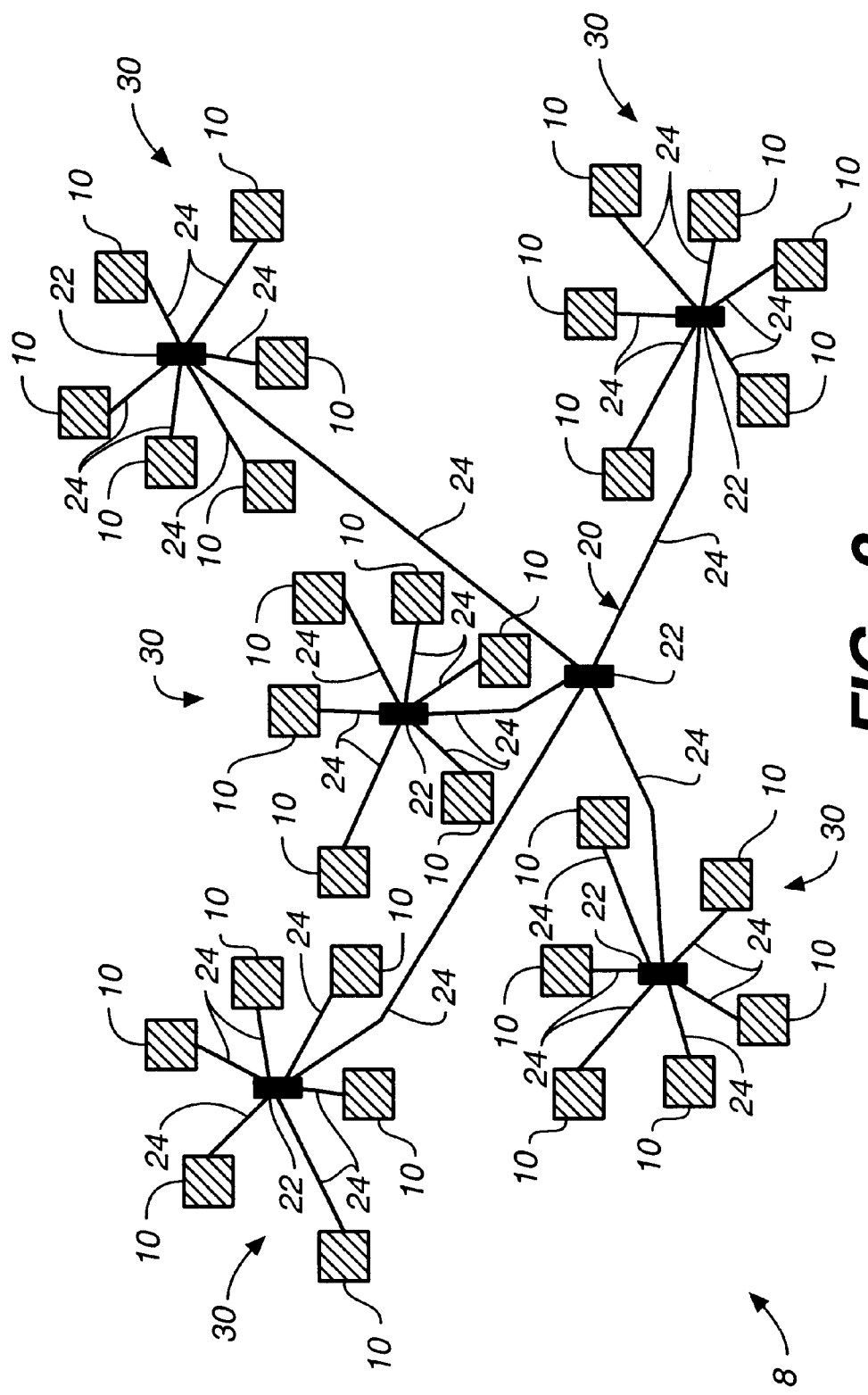
FIG._2

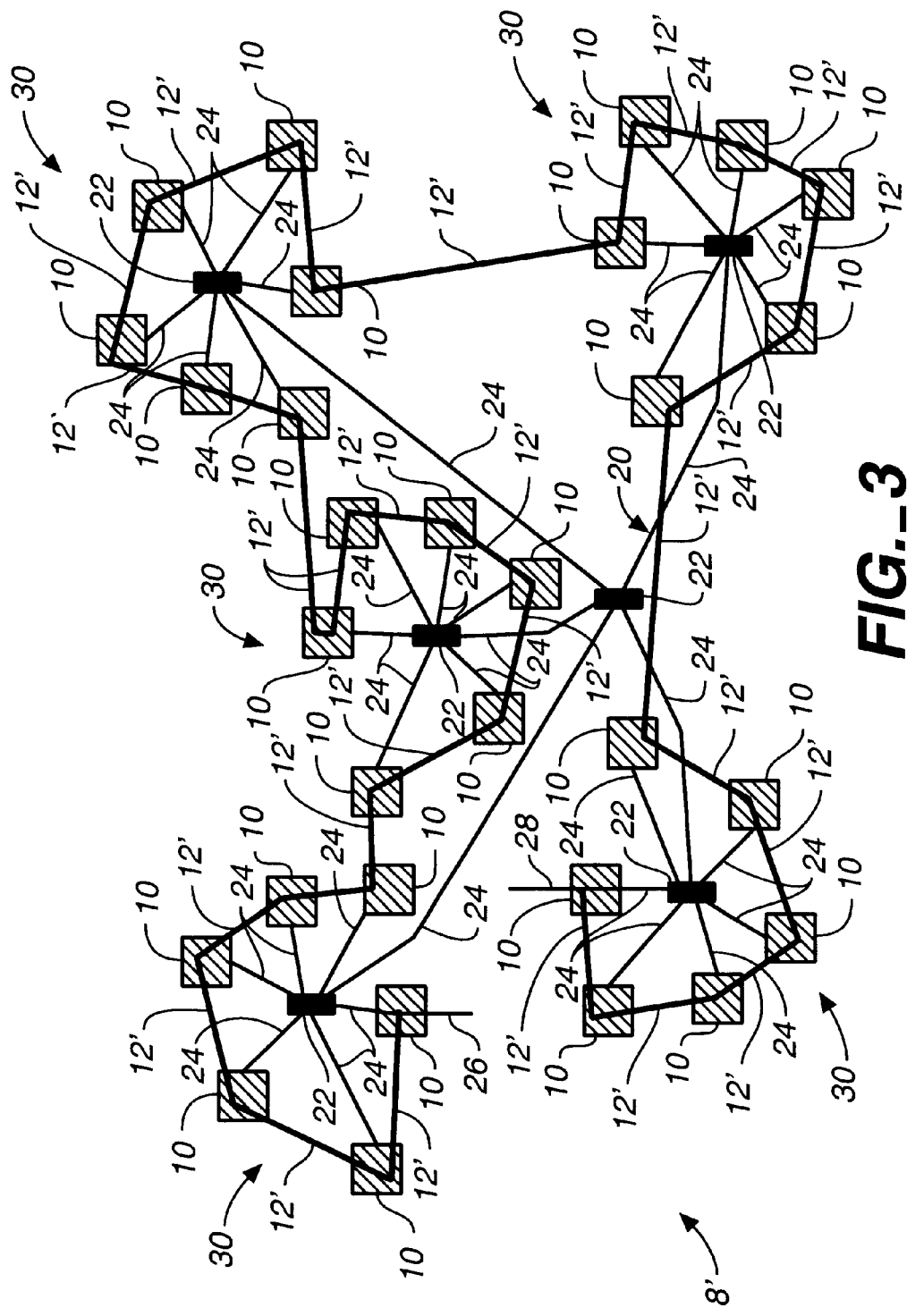
FIG._3

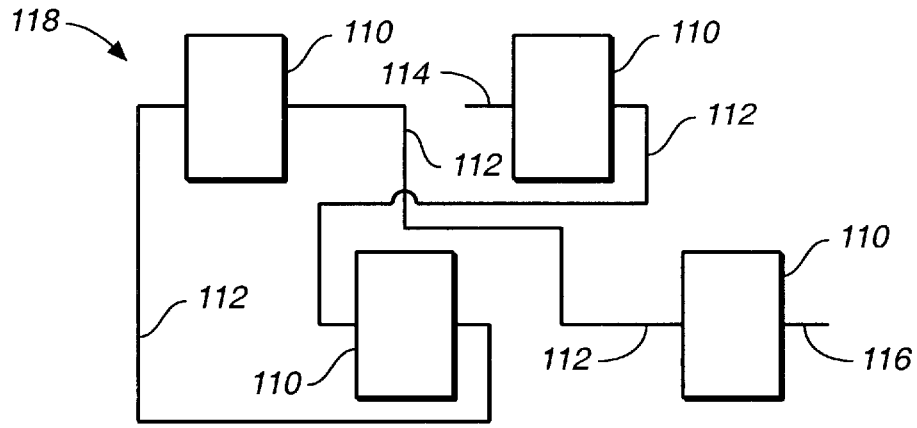
FIG._4A
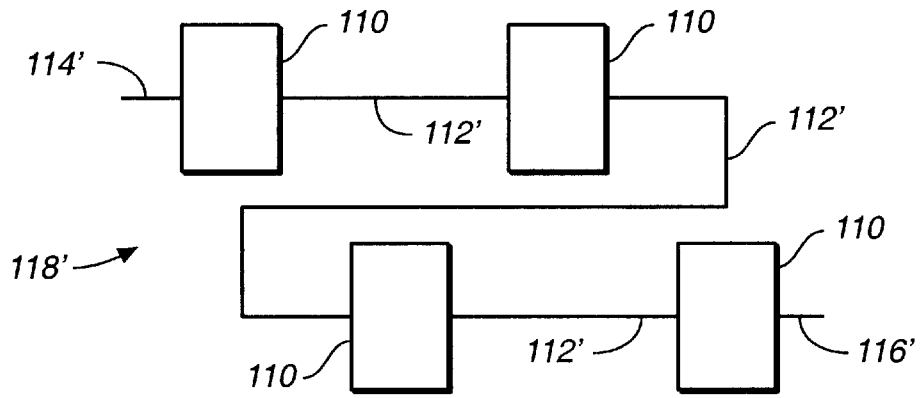
FIG._4B
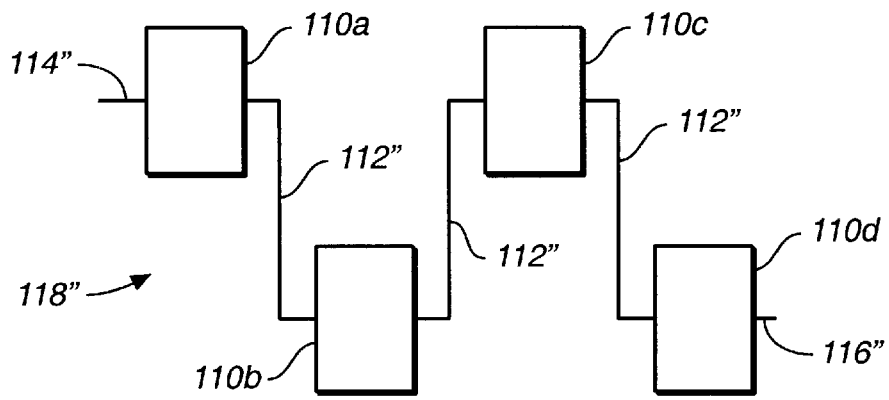
FIG._4C

CLOCK SKEW INSENSITIVE SCAN CHAIN REORDERING

FIELD OF THE INVENTION

The present invention relates to a method of laying out complex circuit designs and more particularly to a method of reordering a scan chain based on the results of distributing a clock signal to eliminate any scan chain hold time failures and minimize chip area overhead required for the scan chain.

BACKGROUND OF THE INVENTION

Integrated circuits utilize a clock signal to control the timing of combinatorial (gates) and sequential (latches, flip-flops) circuit elements contained therein. Ideally, this clock signal must reach the various elements that are physically distributed throughout the integrated circuit at the same time. If the elements are located at varying distances from the source of the clock signal, the clock signal will arrive at different times to the elements over the interconnecting metal leads. This is one cause of a phenomenon known as clock skew. Clock skew can also be caused by the resistance and the capacitance encountered by the clock signal to the various elements. Techniques to compensate for this cause of clock skew include designing the metal leads to have equivalent length and capacitively loading some of the metal leads to equalize the capacitance throughout the clock tree.

Another technique for minimizing clock skew uses multiple buffers to drive the resistance and capacitance encountered by the clock signal. However, these buffers add propagation delays, which also cause clock skew.

With the higher operating frequencies being used in integrated circuits, it is necessary to accurately control the clock by controlling both the capacitive loading due to the metal leads and the buffering of the clock signals. In addition, as integrated circuit fabrication methods provide decreased device and metal lead dimensions in the integrated circuit, resistance is more prominent in effecting clock skew.

In the integrated circuits art, it is often difficult to test sequential circuit elements within the logic of an integrated circuit compared to testing combinatorial circuit elements. As a result, many design for testability methods have been utilized. One such design for testability is a scan path method which enables direct application of test vectors to sequential circuit elements. The sequential circuit elements are serially connected together to form a scan path. A test vector is applied from an input pin to the first sequential circuit element of the scan path. A clock (enable) signal stores the value of the test vector as it propagates through the sequential circuit elements. In essence, the sequential circuit elements function as a shift register. The output from the last sequential circuit element is compared with an expected value. In order to carry out the shift operation of the scan path input vector, the clock signals of adjacent sequential circuit elements should not be active at the same time.

In such a conventional scan path method, problems arise such as erroneous test vector outputs caused by clock skew. The clock skew is caused by the uneven layout of metal leads for each sequential circuit element of the shift register, the buffers inserted to compensate for the insufficient driving capability of the clock signal, etc. Thus, the sequential circuit elements read the input vector at different times, resulting in the failure to operate properly as a shift register.

Typically, the scan path is reordered during the layout process to minimize the chip area overhead of adding the scan path to the design. Examples of such a reordering are disclosed in U.S. Pat. No. 5,307,286 to Rusu et al. entitled "METHOD FOR OPTIMIZING AUTOMATIC PLACE AND ROUTE LAYOUT FOR FULL SCAN CIRCUITS" and U.S. Pat. No. 5,212,651 to Yabe entitled "SCAN PATH GENERATION WITH FLIP-FLOP REARRANGEMENT ACCORDING TO GEOMETRY OF LOGIC CIRCUIT."

U.S. Pat. No. 5,307,286 (the '286 patent) discloses an integrated circuit having flip-flop circuits arranged in rows with buffers that provide signals to those flip-flops. During layout of the integrated circuit, the flip-flops are grouped in rows with similar latches and buffers in a manner that scan enable signal terminals, clock lines and other global signal lines are connected between adjacent flip-flops by abutment. Buffer values are then computed to select the correct buffers to be placed in the rows with the flip-flops.

There are disadvantages to arranging the flip-flops in rows as disclosed in the '286 patent. First, although aligning the flip-flops reduces scan path connection overhead of the chip area, it may increase the connection overhead for connections between the flip-flops and the combinatorial logic. For instance, the connection length between a combinatorial element and an adjacent flip-flop can increase when the flip-flop is aligned with other flip-flops.

Second, there may be clock skew problems between rows of flip-flops that are connected together. Initially, the rows are formed before the clock signal is distributed. Adjacent rows of flip-flops can then be connected together to form part of the scan path. The scan path connections are direct from one sequential circuit element to another. The elements in the scan path are susceptible to hold time failures due to clock skew because of the length of the direct connections between the scan elements. In addition, a clock signal provided to the buffers in one flip-flop row may be skewed with respect to a clock signal provided to the buffers of a directly connected flip-flop row. The clock signals in this case, for example, are provided from different clock buffers of the clock tree.

U.S. Pat. No. 5,212,651 (the '651 patent) discloses a method of scan path generation. The method places flip-flops in a two-dimensional plane according to original scan path data that represents a sequence according to how the flip-flops would originally be connected in the scan path. The flip-flops are then connected in a sequence that meets geometrical design requirements of a logic circuit.

The rearranging of the scan path flip-flops according to the '651 patent simply reduces the length of the scan path interconnections. Clock skew between the flip-flops is not accounted for in the '651 patent. Moreover, the clock skew between the flip-flops can be worsened by the rearranging disclosed in the '651 patent if the new arrangement sequences flip-flops that are not clocked by the same buffered clock signal.

Balanced clock tree is a common method for providing low skew clock distribution. However, even with a low skew clock distribution, hold time failures will occur in the scan path. A hold time failure occurs when the clock skew between two scan elements is greater than the propagation delay minus the hold time of the scan elements. This is becoming a significant issue in integrated circuit testing because the device propagation delays are reducing and RC induced clock skews are increasing with sub-micron technologies. Thus, there arises a significant problem for the ability to use a scan path in an integrated circuit design.

U.S. Pat. No. 5,459,736 to Nakamura entitled "SCAN PATH CIRCUIT FOR TESTING MULTI-PHASE CLOCKS FROM SEQUENTIAL CIRCUITS" and U.S. Pat. No. 5,337,321 to Ozaki entitled "SCAN PATH CIRCUIT WITH CLOCK SIGNAL FEEDBACK, FOR SKEW AVOIDANCE" address clock skewing relative to scan paths.

U.S. Pat. No. 5,459,736 (the '736 patent) discloses a scan path circuit which utilizes at least two test clock signals and additional logic to avoid a malfunction during the scan test due to clock skew. An evident disadvantage to the apparatus disclosed in the '736 patent is that the additional logic and plural clock signals increase the complexity in implementing scan testing. The additional logic and wiring of the two test clock signals will increase the amount of chip area required on an integrated circuit. The complexity of the timing control of the additional logic and the plural signals will also increase. Also, the manufacturing of the integrated circuit will become more complex since the additional logic and plural test clock signals' wiring can require more complex masks and additional steps in fabrication.

U.S. Pat. No. 5,337,321 (the '321 patent) discloses a series of scan path flip-flops that are clocked by a contra-data-direction clock signal. A scan test clock signal is provided to a selector associated with the last flip-flop in the scan path. The selector outputs a delayed scan test clock signal which is provided to the last flip-flop and to another selector associated with a preceding flip-flop of the scan path. The other selector outputs a further delayed scan test clock signal which is provided to the preceding flip-flop and to yet another selector associated with a next-preceding flip-flop of the scan path. This increasing delay of the scan test clock signal is done for each flip-flop remaining in the scan path.

A clear disadvantage of the disclosure of the '321 patent is that the delays of the selectors must be determined with respect to the number of flip-flops in the scan path and the frequency of the clock signal. This determination requires an extra step in the circuit layout step. In addition, the logic of the selectors will increase the amount of chip area required on an integrated circuit and the complexity of the timing control of the additional logic.

Therefore, a need exists for reordering a scan chain during layout that accounts for clock skew related to clock distribution and distance between scan chain elements. A further need exists where such reordering will not require an increase in chip area due to additional logic, clock signals, etc., and will not add complexity to the timing of the scan chain elements. A still further need exists where such reordering will not increase the time and cost of designing and manufacturing the integrated circuit. The present invention meets these needs.

SUMMARY OF THE INVENTION

The present invention includes a method for eliminating scan hold time failures of a scan chain. This method uses information resulting from the distribution of a clock signal throughout an integrated circuit. In particular, a scan chain is reordered according to the results of the distribution of the clock signal. The distribution of the clock signal provides separate groups of sequential circuit elements that form the scan chain. One method of distributing the clock signal contemplated by the present invention is a clock balancing method.

Once the sequential elements are defined into separate groups, connections within and between those groups are made. This eliminates clock signal skew for the scan chain. It also provides for reducing the length of the connections within each group. As a result, there is a corresponding reduction in chip area overhead for integration of the scan chain in the circuit.

The present invention further provides a method of reordering sequential elements in a group according to physical location. The sequential elements are then reordered to compensate for clock skew among the sequential elements to eliminate hold time problems.

The present invention also provides for an integrated circuit, including sequential and combinatorial circuit elements coupled to receive a clock signal, that has a scan path of sequential circuit elements reordered according to groups defined by the distribution of the clock signal.

Numerous other advantages and features of the present invention will become readily apparent from the following detailed description of the invention and the embodiments thereof, from the claims and from the accompanying drawings in which details of the invention are fully and completely disclosed as a part of this specification.

DETAILED DESCRIPTION OF THE DRAWINGS

FIG. 1 is a block diagram of a scan chain including sequential circuit elements according to original scan chain connections;

FIG. 2 is a block diagram of a balanced clock tree connected to the sequential elements of FIG. 1;

FIG. 3 is a block diagram of a scan chain including sequential circuit elements of FIG. 1 reordered according to the present invention; and FIGS. 4A–C are block diagrams illustrating another method of reordering according to the present invention.

DETAILED DESCRIPTION OF THE INVENTION

While this invention is susceptible of embodiment in many different forms, there are shown in the drawings and will be described herein in detail specific embodiments thereof with the understanding that the present disclosure is to be considered as an exemplification of the principles of the invention and is not to be limited to the specific embodiments described.

According to a typical scan chain technique, sequential circuit elements are designed so that in the absence of a scan enable signal, for example, they function as a part of the overall design in the integrated circuit. When the scan enable signal is provided, the sequential circuit elements are connected to form a scan chain where the sequential elements are linked together to form one extended shift register. These sequential elements are serially clocked to receive generated test vectors. A test vector is applied with the scan enable signal, the scan enable signal is then removed, and the integrated circuit is functionally operated for at least one clock pulse. The scan enable signal is then provided again and the test vector is scanned out of the extended shift register for comparison with an expected pattern. The present invention includes this type of testing.

Referring to FIG. 1, a scan chain 8 is illustrated that includes sequential circuit elements 10, such as conventional scan chain flip-flops, ordered according to a designer's original scan chain connections 12. Note that the placement of connections 12 are not dictated by the proximity of adjacent sequential circuit elements 10. The connections 12 are not optimized for length, which results in an increased chip area overhead for the scan chain connections 12. Connection 14 is typically coupled to an input pad that is coupled to receive the input test vector. Connection 16 is typically coupled to an output pad that is coupled to provide the output of scan chain 8.

Turning to FIG. 2 (connections 12 are removed for clarity), clock tree 20 including clock buffers 22 and clock connections 24 are laid out according to a conventional clock balancing technique. FIG. 2 illustrates such a balanced clock tree that is known in the art. Examples of other methods for clock distribution are mesh and H-tree, which are also known in the art and encompassed by the present invention. Note that sequential circuit elements 10 use the same clock signal.

The clock balancing process defines the sequential circuit elements 10 into groups 30 having associated clock buffers 22. Sequential circuit elements 10 within each of these groups 30 are close enough to each other so that the clock signal provided by the associated clock buffer 22 will typically have very small skew over clock connections 24. However, if there is skew that will cause hold time problems, the scan chain connecting for the sequential circuit elements 10 can be rearranged to eliminate those problems. Specifically, the scan chain connecting for the sequential circuit elements 10 can be ordered so that each succeeding sequential circuit element 10 in the group receives a clock signal with less skew than the clock signal for the preceding sequential circuit element 10. This reordering method will connect the sequential circuit elements 10 to eliminate all possible hold time failures within the respective groups.

Referring to FIG. 3, groups 30 defined by the balancing of the clock tree 20 are used to reorder sequential circuit elements 10. Reordering in this manner will reduce the amount of clock signal skew among the grouped sequential circuit elements 10. The clock signal skew within the groups 30 is less than the clock signal skew for the entire scan chain. In addition, scan chain connections 12' are optimized, thus reducing chip area overhead for the inclusion of the scan path in an integrated circuit. Connection 26 is typically coupled to an input pad that is coupled to receive the input test vector. Connection 28 is typically coupled to an output pad that is coupled to provide the output of scan chain 8'.

Connections between groups 30 can be determined by the relative clock signal skew between groups 30. For example, groups 30 should be ordered so that each succeeding group 30 in the scan chain receives a clock signal with less skew than the clock signal for the preceding group 30. Thus, this reordering method will connect the scan chain of sequential circuit elements 10 to eliminate all possible hold time failures.

Another embodiment of the present invention is illustrated in FIGS. 4A–C. As shown in FIG. 4A, a scan chain 118 is illustrated that includes sequential circuit elements 110 that are ordered according to a designer's original scan chain connections 112. Connection 114 is typically coupled to an input pad that is coupled to receive the input test vector. Connection 116 is typically coupled to an output pad that is coupled to provide the output of scan chain 118.

FIG. 4B shows scan chain 118' reordered according to the physical placement of sequential circuit elements 110 with connections 112'. Although this minimizes the amount of channel space which is occupied by scan chain 118', clock skew has not been taken into account. Connection 114' is typically coupled to an input pad that is coupled to receive the input test vector. Connection 116' is typically coupled to an output pad that is coupled to provide the output of scan chain 118'.

If the ordering illustrated in FIG. 4B exhibits clock skew between sequential circuit elements 110, hold time problems will prevent its effective use in an integrated circuit. For example, each sequential circuit element 110 can be connected to different clock buffers (not shown). This in itself may cause a clock skew among sequential circuit elements 110.

To overcome the clock skew described above, sequential circuit elements 110 are reordered according to the relative skew among them. In particular, sequential circuit elements 110 can be ordered so that each succeeding sequential circuit element 110 in the group receives a clock signal with less skew than the clock signal for the preceding sequential circuit element 110. This reordering method will connect the sequential circuit elements 110 to eliminate all possible hold time failures within the respective groups.

Specifically referring to FIG. 4C, sequential circuit element 110a starts the scan chain because it receives a clock signal (not shown) that has the most skew relative to sequential circuit element 110d. Sequential circuit element 110a is connected by connection 112" to sequential circuit element 110b. Sequential circuit element 110b receives a clock signal (not shown) that has less skew than the clock signal provided to sequential circuit element 110a and has greater skew than the clock signal provided to sequential circuit element 110d.

Sequential circuit element 110b is connected by connection 112" to sequential circuit element 110c. Sequential circuit element 110c receives a clock signal (not shown) that has less skew than the clock signals provided to sequential circuit elements 110a and 110b, and has greater skew than the clock signal provided to sequential circuit element 110d. Reordering sequential elements 110 according to clock skew will eliminate corresponding hold time problems for each respective group of the scan chain.

Connection 114" is typically coupled to an input pad that is coupled to receive the input test vector. Connection 116" is typically coupled to an output pad that is coupled to provide the output of scan chain 118".

Numerous variations and modifications of the embodiment described above may be effected without departing from the spirit and scope of the novel features of the invention. For example, the method of the present invention can be integrated with the clock tree balancing (generation) process or it can be run separately using the results from that clock tree generation. The results define the groups that form the scan chain.

It is to be understood that no limitations with respect to the specific device illustrated herein are intended or should be inferred. It is, of course, intended to cover by the appended claims all such modifications as fall within the scope of the claims.

I claim:

1. A method for eliminating scan hold time failures of a scan chain comprising the steps of:
    distributing a clock signal; and
    ordering the scan chain according to the distribution of the clock signal.

2. The method of claim 1 wherein the step of distributing includes balancing a clock tree to provide the clock signal.

3. The method of claim 1 wherein the step of distributing provides groups of sequential circuit elements of the scan chain.

4. The method of claim 3 wherein the step of ordering utilizes the groups of sequential circuit elements.

5. The method of claim 3 further comprising the step of reordering the sequential circuit elements within at least one group according to a clock skew of the clock signal within the at least one group.

6. The method of claim 3 further comprising the step of ordering the groups according to a clock skew of the clock signal between the groups.

7. A method for eliminating scan hold time failures of a scan chain comprising the steps of:

ordering a scan chain;

balancing a clock tree connected to the scan chain; and reordering the scan chain according to the balanced clock tree.

8. A method of reordering a scan chain comprising the step of reordering the scan chain according to groups defined by distribution of a clock signal, wherein the clock signal is provided to sequential elements of the scan chain.

9. A method for eliminating scan hold time failures of a scan chain comprising the steps of:

ordering a scan chain which includes groups of sequential circuit elements;

reordering the sequential circuit elements according to physical location; and reordering the sequential circuit elements of at least one of the groups according to the clock skew among the sequential circuit elements of the at least one of the groups.

10. An integrated circuit, including sequential and combinatorial circuit elements coupled to receive a clock signal, comprising a scan path including sequential circuit elements reordered according to groups defined by a distribution of the clock signal.

11. The integrated circuit of claim 10 further comprising the sequential circuit elements reordered within at least one group according to a clock skew of the clock signal within the at least one group.

12. The integrated circuit of claim 10 further comprising the groups ordered according to a clock skew of the clock signal between the groups.

* * * * *